United States Patent [19]
Cunningham et al.

[11] Patent Number: 5,940,723
[45] Date of Patent: Aug. 17, 1999

[54] HETEROEPITAXIAL GROWTH OF III-V MATERIALS

[75] Inventors: John Edward Cunningham, Lincroft; Keith Wayne Goossen, Aberdeen, both of N.J.

[73] Assignee: Lucent Technologies Inc., Murray Hill, N.J.

[21] Appl. No.: 09/017,376

[22] Filed: Feb. 3, 1998

[51] Int. Cl.[6] .................................................. H01L 21/20
[52] U.S. Cl. ........................................... 438/508; 438/758
[58] Field of Search .................................. 438/758, 761, 438/763, 767, 778, 779, 507, 508

[56] References Cited

U.S. PATENT DOCUMENTS 4,863,877  9/1989  Fan et al. .
4,876,218  10/1989  Pessa et al. .
5,063,166  11/1991  Mooney et al. .
5,659,187  8/1997  Legoues et al. .

OTHER PUBLICATIONS

Soderstrom et al., "Molecular beam epitaxy growth and characterization of InSb layers on GaAs substrates", Semiconductor Science and Technology, vol. 7, pp. 337–343 (no month given), 1992.

Primary Examiner—Charles Bowers
Assistant Examiner—K. Christianson

[57] ABSTRACT

The specification describes a process for growing device quality III–V heteroepitaxial layers without the use of buffer layers, i.e. largely defect free layers with thicknesses greater than 50 Angstroms directly on the III–V substrate. These high quality heteroepitaxial layers are grown by low temperature MBE.

7 Claims, 2 Drawing Sheets

HETEROEPITAXIAL GROWTH OF III-V MATERIALS

FIELD OF THE INVENTION

This invention relates to methods for growing high quality III–V semiconductor layers on semiconductor substrates. The invention is particularly suited for producing substrates useful for the manufacture of photonic devices.

BACKGROUND OF THE INVENTION

Efforts to grow high quality, largely defect-free epitaxial layers of III–V semiconductors have been ongoing for several decades. During most of this period the use of silicon homoepitaxy, a straightforward process, has satisfied most of the commercial needs of the semiconductor technology. However, with the rapid growth of the photonics industry, and the increasingly sophisticated materials systems required for that technology, there is new impetus for the development of more effective processes for making heteroepitaxial layers in photonic materials. One of the prevalent heteroepitaxial combinations in current photonics technology is GaAs on InP. InP is a preferred substrate material because its physical properties, e.g. lattice characteristics, are reasonably dose to the active layers of interest (GaAs and GaAs ternary and quaternary materials), and it is semi-insulating. The latter property is useful for optoelectric integrated circuits (OEICs).

A variety of devices can be fabricated using this heteroepitaxial combination including lasers, modulators, and MESFET and HEMT transistors. III–V transistors may be used in purely electrical devices but are typically integrated with photonic devices as drivers for lasers etc., making the overall IC functionally photonic.

The use of InP itself as both a substrate and active semiconductor layer is convenient and eliminates the need to resort to heteroepitaxial methods. Laser-MODFET devices on InP have been reported by Y. H. Lo et al, "Multigigabit/s 1.5 $\mu$m $\lambda$/4-shifted DFB OEIC transmitter", *IEEE Photonics Tech. Lett.*, 1990, 2, (9), pp. 673–675. Laser-MISFET devices on InP have been reported by G. Post et al, "10 Gbit/s operations of integrated BRS laser-MISFET on indium phosphide", *Microelectr. Eng.*, 1992, 19, pp.219–222. While these devices are useful, GaAs is a more effective material for transistor devices, and for long wavelength infra-red optical devices. Thus the ideal OEIC device uses GaAs and GaAs based semiconductor materials in the active layers, and InP as the substrate.

Techniques used to produce GaAs/InP structures are typically metal-organic chemical vapor deposition (MOCVD) and molecular beam epitaxy (MBE). GaAs/InP MESFET devices made by MOCVD have been reported by F. Ren et al,. "Performance of GaAs MESFETs on InP substrates", *IEEE Electr. Dev. Lett.*, 1898, 10, pp. 389–390. Similar devices produced by MBE have been reported by Y. H. Lo et al, "High speed GaAs on InP long wavelength transmitter OEICs", Electron. Lett., 1989, 25, (10), pp. 666–667. O. Calliger et al also describe GaAs/InP heteroepitaxial techniques for OEIC devices in 8 Gbit/s GaAs-on-InP 1.3 $\mu$m wavelength OEIC transmitter, *IEEE Proc.-Optoelectron.*, 142, (1), Feb. 1995, pp. 13–16.

The heteroepitaxial process described by Calliger et al is typical of the prior art processes. Due to the significant (~5%) lattice mismatch between the InP substrate and the GaAs layer being deposited, the GaAs layer is highly strained and grows with large numbers of defect sites. The growth mechanism of GaAs/InP heteroepitaxy has been studied in some detail by Tanaka et al, "GaAs Heteroepitaxial Growth on an InP (001) Substrate", Japanese Journal of Applied Physics, Vol. 30, No. 9B, September 1991, pp. L 1662-L 1664. They report two dimensional (defect free) growth of GaAs for the first monolayer but, as observed by others, growth quickly deteriorates to three dimensional (strained). Defect free growth beyond 10–20 Angstroms has not been achieved reproducibly in GaAs /InP heteroepitaxial processes to date.

The effects of strained epitaxial growth in the GaAs/InP system have been partially overcome by the use of buffer layers. When GaAs growth is continued for an extended period the influence of the InP lattice decreases and eventually the dominant morphology of the grown layer reflects the properties of the GaAs lattice. At this point the GaAs layer has sufficiently few lattice defects that it is considered to be of device quality. However, to reach this state requires a buffer region of highly dislocated GaAs of the order of several microns in thickness. At typical growth rates of 0.1–1.0 monolayer (ML) per second the processing time required to produce the buffer layer is substantial and adds to the cost of the process. A process that allows the elimination of the buffer layer would be a significant advance in the technology.

STATEMENT OF THE INVENTION

We have developed a GaAs/InP heteroepitaxial process that produces essentially defect free initial growth layers with thicknesses well beyond the limitations known in the prior art. With proper choice of MBE growth parameters we have grown essentially defect free GaAs layers on InP with thicknesses of a few hundred Angstroms without using buffer layers. An important aspect of the invention is the recognition that the process thermodynamics favor two dimensional GaAs growth well beyond the 10–20 Angstrom limit known in the art if the growth temperature is kept sufficiently low.

DETAILED DESCRIPTION

Figure 1:
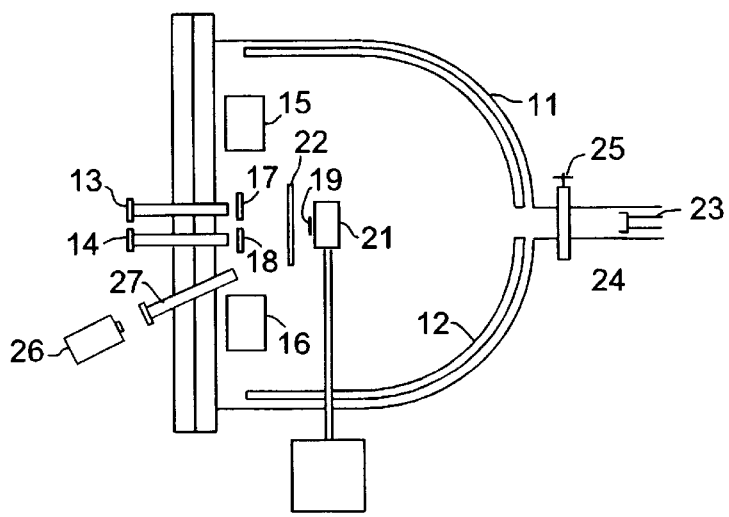
FIG. 1 is a schematic view of a typical MBE apparatus useful in the process of the invention.

Apparatus for MBE is available commercially, and basic processing details are widely available in the literature. A typical apparatus is shown in FIG. 1. The interior of the ultra-high vacuum chamber 11 is equipped with liquid $N_2$ shrouds 12 for minimizing contamination from the chamber walls. The precursor materials are pre-processed in effusion cells and introduced into the vacuum chamber through effusion cell ports 13 and 14. Additional liquid $N_2$ cooled shrouds, 15, 16, are placed adjacent the ports to reduce thermal crosstalk and intercontamination between sources. Effusion cell shutters 17 and 18 are provided to control flow of precursor materials. The substrate 19 is held by sample holder 21, and a shutter 22 controls onset of growth. The substrate is loaded with a loading tool 23 through vacuum interlock 24 operated with gate valve 25. An optical (IR) pyrometer 26 is aligned with the substrate through window 27 to monitor the substrate temperature.

In the MBE growth of GaAs, Ga atoms and $As_2$ or $As_4$ are introduced into the vacuum chamber through effusion cell ports in a known manner. The vacuum in the chamber is of the order of $10^{-8}$–$10^{-11}$ Torr, usually greater than $10^{-9}$ Torr. Precursor atoms (Ga) and molecules (As) impinge on the substrate surface and combine as GaAs in a single molecular layer. The well known growth characteristic of MBE is by a sequence of monolayers and is therefore stoichiometrically pure and crystallographically homogeneous. An important consequence of this growth mechanism is that layer thickness is exceptionally uniform.

Deposition rates may be controlled by the flux of the precursor materials. Typically the Ga flux is of the order of $10^{14}$ to $10^{15}$ atoms per $cm^2$ per second and the arsenic flux is $10^{15}$ to $10^{16}$ atoms/$cm^2$/s. Dopants may be introduced into the layers if desired using an additional effusion cell and port. The growth temperature for prior art processes is typically 500–600 °C. and the growth rate is typically 0.1–1.0 monolayers ML/sec. GaAs growth begins as epitaxial with low defect density but, as stated above, the crystal quality of the grown material rapidly deteriorates as growth proceeds leading to a strained layer with very high defect density.

According to the invention the substrate temperature at the onset of growth is maintained below 460° C. Growth begins as epitaxial (lattice matched to InP) and continues epitaxial for thicknesses of tens and hundreds of Angstroms, i.e., well beyond the thicknesses of prior art processes and sufficient to form device layers.

The following examples of the process demonstrate the efficacy of the heteroepitaxial technique.

EXAMPLE I

A (100) oriented semi-insulating InP substrate was placed in a vacuum of $10^{-10}$ Torr in the MBE chamber. The substrate temperature was approximately 400° C. Ga was introduced at a flux of $5\times10^{14}$ atoms/$cm^2$/and arsenic at a flux of $5\times10^{15}$ atoms/$cm^2$/. Growth continued for 2 minutes. A smooth heteroepitaxial GaAs layer was produced with a thickness of 300 Angstroms. The surface smoothness was measured with an optical profilometer and the results are given in FIG. 2.

Figure 2:
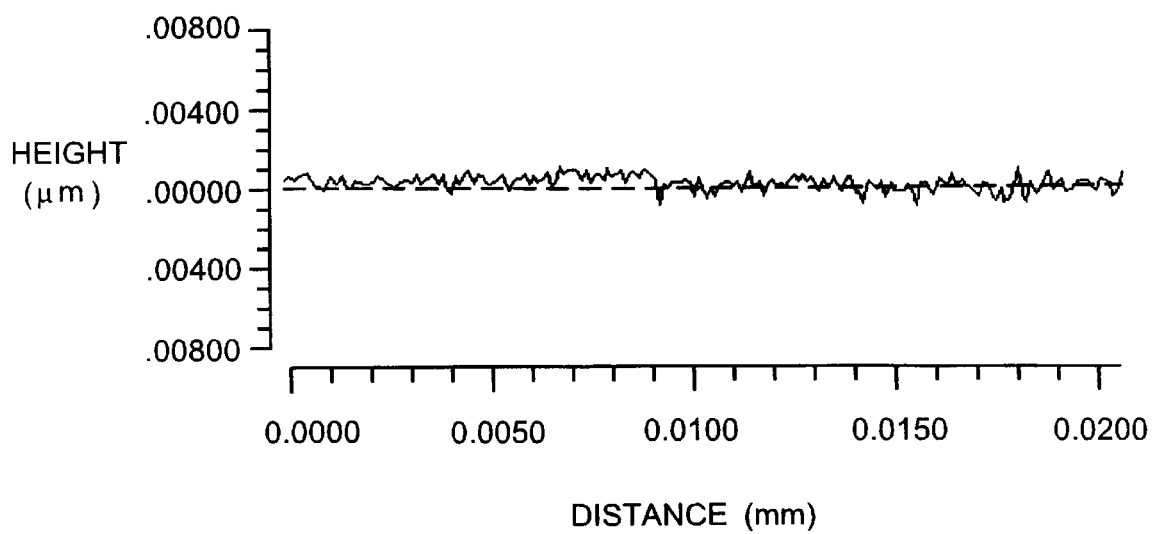
FIG. 2 is a profilometer plot of the surface of a heteroepitaxial layer produced by the process of the invention.
Figure 3:
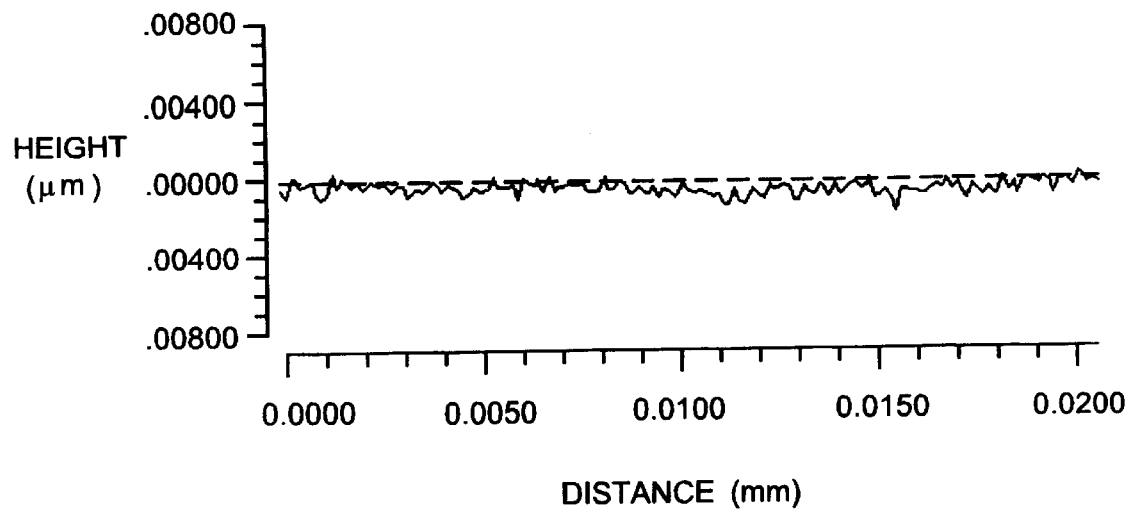
FIG. 3 is a profilometer plot, for comparison with that of FIG. 2, of the surface of a control sample with an essentially perfect semiconductor surface.

To demonstrate the unexpected smoothness of the grown GaAs layer of Example I the results shown in FIG. 2 were compared with a control sample. The control sample was a device quality GaAs wafer manufactured by Freiberger Co. and had an essentially perfect GaAs surface. The results are shown in FIG. 3. The surface smoothness of the GaAs layer grown by low temperature heteroepitaxy according to the invention is essentially indistinguishable from the essentially perfect GaAs surface of the control sample.

Figure 4:
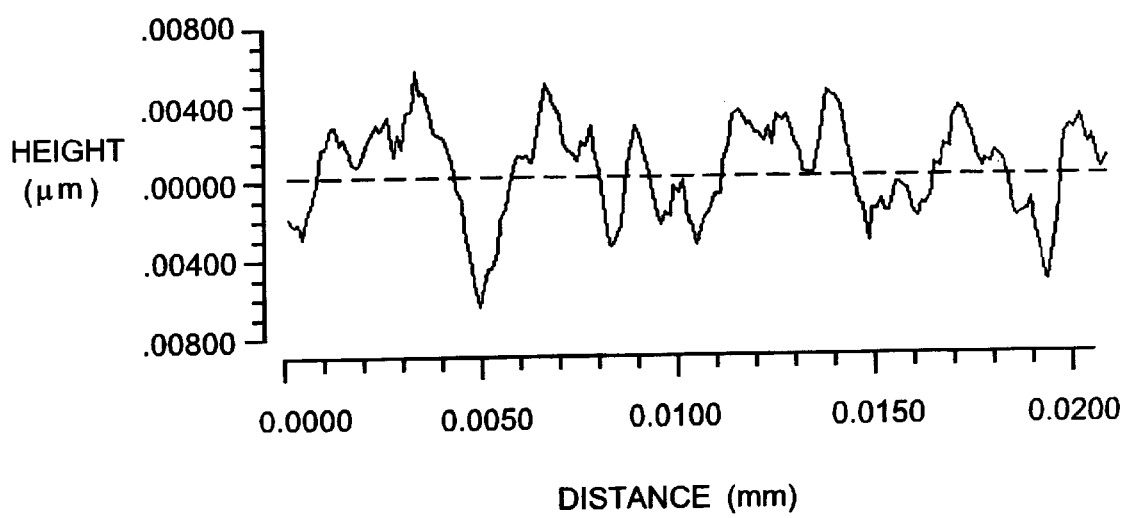
FIG. 4 is a profilometer plot, also for comparison with that of FIG. 2, of a heteroepitaxial layer produced by the typical prior art MBE process.

An additional comparison was made with a GaAs surface prepared according to prior art techniques. The surface of a GaAs layer grown by MBE to a thickness of 5000 Angstroms was analyzed and the profilometer data is given in FIG. 4. This surface is typical of those produced by high temperature (>500° C.) heteroepitaxial MBE processes. The surface demonstrates three dimensional growth and is characteristic of material with large numbers of dislocation defects.

EXAMPLE II

The procedure used in Example I was followed except that the substrate was maintained at a temperature of approximately 450° C. The results were two dimensional growth of GaAs on InP leading to an atomically smooth surface morphology.

Based on these and other experiments the low temperature heteroepitaxial MBE process of the invention is characterized by a temperature in the range 380° C. to 475° C. and preferably 380–450° C. It is expected that consistently good results can be expected for MBE growth in this temperature range.

The lattice mismatch between GaAs and InP is relatively large, i.e. 5%, and, as described earlier, it is the lattice mismatch that causes the growth problems that this invention is intended to overcome. With the demonstration of the effectiveness of the invention with materials having significant mismatch, i.e. GaAs and InP, it would be expected by those skilled in the art that the low temperature MBE process of the invention would be effective with any material system with a lattice mismatch of approximately 5% or less. The lattice mismatch should also be at least 2% to define a heteroepitaxial regime in which the problems addressed by the invention are presented.

Thus the appropriate scope of the invention is for the production of binary, ternary and quaternary III–V growth layers on III–V binary, ternary and quaternary substrates. The III–V materials of interest are binary, ternary and quaternary combinations of Ga, Al, In, As, and P.

It should be evident from the foregoing description that the improved MBE process of this invention can produce high quality heteroepitaxial layers of a III–V semiconductor material directly on a substrate of a different III–V semiconductor material with a layer thickness large enough to be useful for the manufacture of semiconductor devices. A useful thickness in this context is greater than 50 Angstroms, and more typically greater than 200 Angstroms. Accordingly in defining the process of the invention, a step in the process is to produce a semiconductor device in the heteroepitaxial layer without the necessity for producing additional layers, e.g. buffer layers. The techniques for producing devices in the layer are well known and themselves form no part of the invention. However the step of producing such devices in a relatively thin III–V layer such as GaAs formed directly on a heteroepitaxial III–V substrate such as InP is an essential aspect of the invention. Typically, producing a semiconductor device in the heteroepitaxial layer involves the formation of one or more impurity regions in the layer, typically by implantation.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of III–V semiconductor devices having an epitaxial layer of a first III–V semiconductor material on a substrate of a second III–v semiconductor material and in which the lattice constant of the first and second semiconductor materials have a mismatch of 2–5%, the process comprising the steps of:

a. placing said substrate in a vacuum chamber with a vacuum of less than $10^{-8}$ Torr, b. heating the substrate to a temperature greater than 390° C. and less than 475° C.; in the range 380–475° C., c. introducing a source of the group III element of the said first semiconductor material into the vacuum chamber, d. introducing a source of the group V element of the said first semiconductor material into the vacuum chamber, e. growing a III–V heteroepitaxial layer directly on said substrate said III–V heteroepitaxial layer having a thickness of at least 50 Angstroms, and f. producing a semiconductor device by forming at least one impurity region in said heteroepitaxial layer.

2. The method of claim 1 in which the III–V material of said layer and the III–V material of said substrate comprise combinations of Ga, Al, In, As, and P.

3. The method of claim 2 in which the III–V material of the substrate is selected from the group consisting of InP, InAsP, InAlAsP and InAlP.

4. The method of claim 2 in which the material of the heteroepitaxial layer is selected from the group consisting of GaAs, GaAlAs, GaP, GaAlP and GaAlPAs.

5. The method of claim 2 in which the material of the substrate is InP and the material of the heteroepitaxial layer is GaAs.

6. A method for the manufacture of III–V semiconductor devices having a GaAs heteroepitaxial layer on an InP substrate, the process comprising the steps of:

a. placing an InP substrate in a vacuum chamber with a vacuum of greater than $10^{-9}$ Torr, b. heating the substrate to a temperature in the range 380–475° C., c. introducing a source of gallium into the vacuum chamber with a flux in the range $10^{14}$ to $10^{15}$ atoms/cm$^2$/s, d. introducing a source of a arsenic into the vacuum chamber with a flux in the range $10^{15}$ to $10^{16}$ atoms/cm$^2$/s, e. growing a GaAs heteroepitaxial layer directly on said substrate said GaAs layer having a thickness of at least 200 Angstroms, and f. producing a semiconductor device by forming at least one impurity region in said GaAs heteroepitaxial layer.

7. The method of claim 6 in which the temperature in step b. is in the range 380–450° C.

* * * * *